(12) United States Patent
Satoh

(10) Patent No.: US 7,528,390 B2
(45) Date of Patent: May 5, 2009

(54) BROAD BEAM ION IMPLANTATION ARCHITECTURE

(75) Inventor: Shu Satoh, Byfield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 272 days.

(21) Appl. No.: 11/540,897

(22) Filed: Sep. 29, 2006

(65) Prior Publication Data

US 2008/0078956 A1    Apr. 3, 2008

(51) Int. Cl.
*H01J 37/08* (2006.01)
*H01J 37/317* (2006.01)
*H01J 37/302* (2006.01)

(52) U.S. Cl. .............................. 250/492.21; 250/492.2; 250/492.3; 250/396 R

(58) Field of Classification Search .................. 250/281, 250/282, 294, 296, 298, 397, 398, 396 R, 250/396 ML, 492.21, 492.3
See application file for complete search history.

(56) References Cited

U.S. PATENT DOCUMENTS

| | | | | |
|---|---|---|---|---|
| 4,912,405 A | * | 3/1990 | Richardson | 324/751 |
| 5,350,926 A | * | 9/1994 | White et al. | 250/492.21 |
| 5,834,786 A | * | 11/1998 | White et al. | 250/492.21 |
| 6,403,967 B1 | * | 6/2002 | Chen et al. | 250/396 ML |
| 6,635,880 B1 | * | 10/2003 | Renau | 250/396 ML |
| 2003/0205683 A1 | * | 11/2003 | Benveniste | 250/492.21 |
| 2005/0258380 A1 | * | 11/2005 | White et al. | 250/492.21 |
| 2006/0113493 A1 | * | 6/2006 | Kabasawa et al. | 250/492.21 |
| 2007/0187619 A1 | * | 8/2007 | Kellerman et al. | 250/492.21 |
| 2008/0067444 A1 | * | 3/2008 | Benveniste et al. | 250/492.21 |
| 2008/0078955 A1 | * | 4/2008 | Graf et al. | 250/492.21 |
| 2008/0078956 A1 | * | 4/2008 | Satoh | 250/492.21 |

* cited by examiner

*Primary Examiner*—Bernard E Souw
(74) *Attorney, Agent, or Firm*—Eschweiler & Associates, LLC

(57) ABSTRACT

An ion implantation system for providing a mass analyzed ribbon beam that comprises an ion beam source that includes a plasma source and an extraction component, wherein the extraction component is configured to extract a diverging ion beam and direct the ion beam to a window frame magnet assembly. The window frame magnet assembly comprises two pairs of coils orthogonally arranged within a window shaped yoke to produce an independently controllable uniform cross-field magnetic field. The first set of coils create an uniform field across the width of the diverging beam to convert it to a uniform parallel broad ion beam. The second set of coils bend the sheet of the ion beam in orthogonal direction to give mass dispersion for ion mass selection.

14 Claims, 16 Drawing Sheets

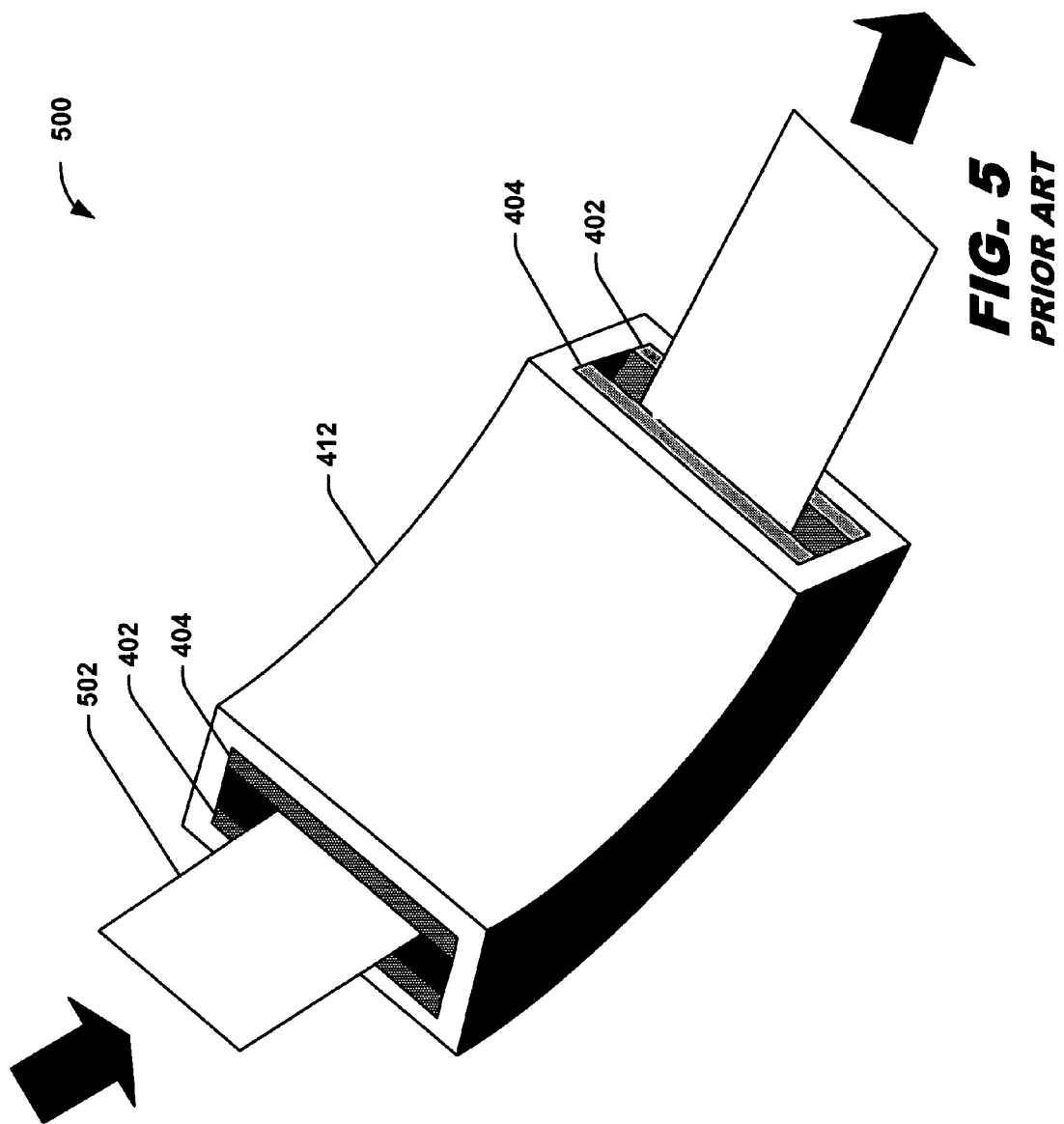

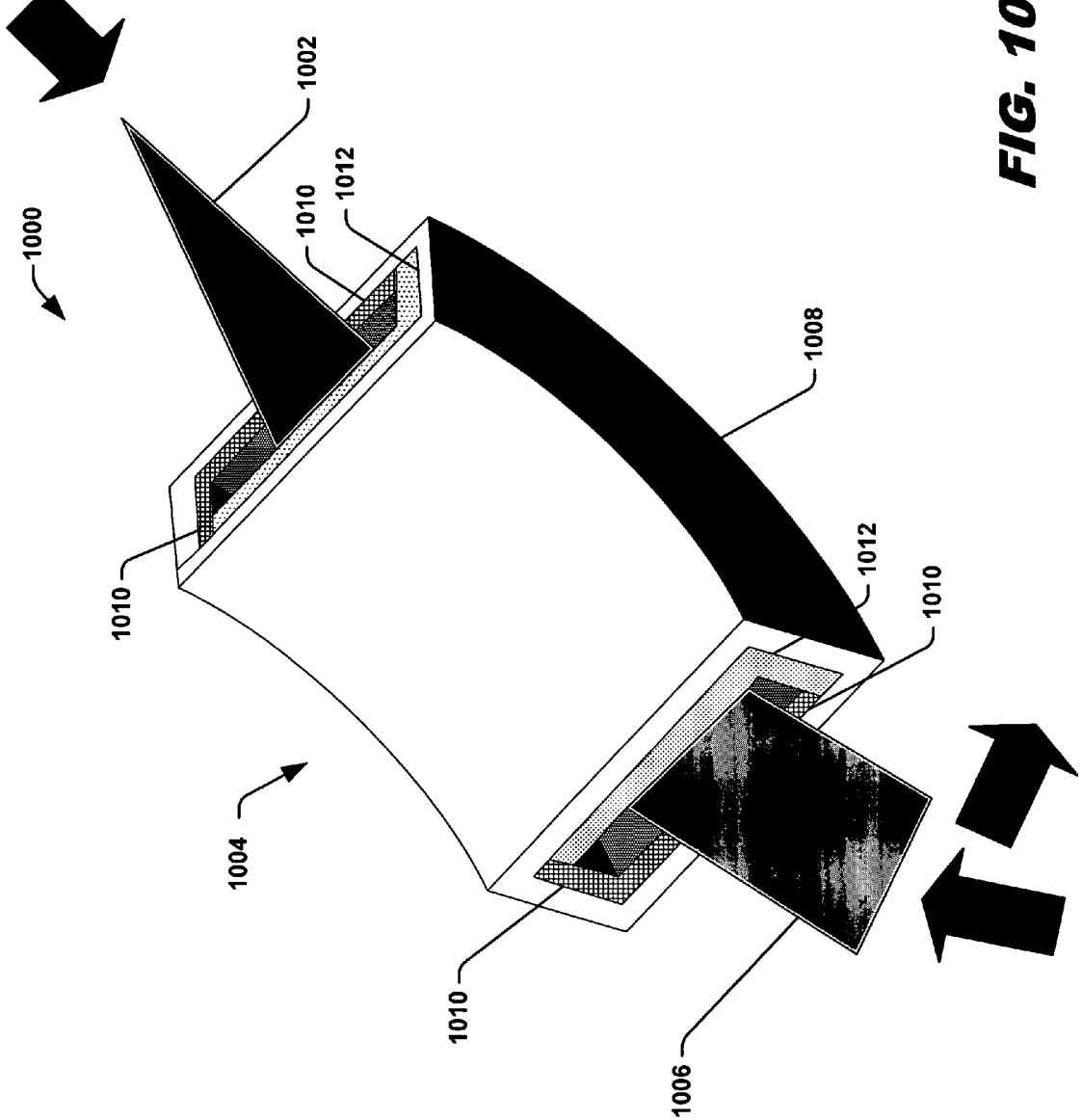

BROAD BEAM ION IMPLANTATION ARCHITECTURE

FIELD OF THE INVENTION

The present invention relates generally to ion implantation systems, and more particularly to a window frame magnet assembly for providing mass resolved ribbon beams in ion implantation systems.

BACKGROUND OF THE INVENTION

Ion implantation systems or ion implanters are widely used to dope semiconductors with impurities in integrated circuit manufacturing, as well as in the manufacture of flat panel displays, for example. In such systems, an ion source ionizes a desired dopant element, which is extracted from the source in the form of an ion beam of desired energy. The ion beam is then directed at the surface of the workpiece, such as a semiconductor wafer, in order to implant the workpiece with the dopant element. The ions of the beam penetrate the surface of the workpiece to form a region of desired conductivity, such as in the fabrication of transistor devices in the wafer. The implantation process is typically performed in a high vacuum process chamber which prevents dispersion of the ion beam by collisions with residual gas molecules and which minimizes the risk of contamination of the workpiece by airborne particles. A typical ion implanter includes an ion source for generating the ion beam, a beamline including a mass analysis magnet for mass resolving the ion beam, and a target chamber containing the semiconductor wafer or other substrate to be implanted by the ion beam, although flat panel display implanters typically do not include a mass analysis apparatus. For high energy implantation systems, an acceleration apparatus may be provided between the mass analysis magnet and the target chamber for accelerating the ions to high energies.

Conventional ion sources include a plasma confinement chamber having an inlet aperture for introducing a gas to be ionized into plasma and an exit aperture opening through which the plasma is extracted to form the ion beam. One example of a gas is phosphine. When phosphine is exposed to an energy source, such as energetic electrons or radio frequency (RF) energy, for example, the phosphine can disassociate to form positively charged phosphorous (P+) ions for doping the workpiece and hydrogen ions. Typically, phosphine is introduced into the plasma chamber and then exposed to the energy source producing both phosphorous ions, hydrogen ions and electrons. The plasma comprises ions desirable for implantation, phosphorous ions, into a workpiece, as well as undesirable ions, hydrogen ions, and electrons which are a by-product of the dissociation and ionization processes. The phosphorous ions and the hydrogen ions are then extracted through the exit opening into the ion beam using an extraction apparatus including energized extraction electrodes. To exclude unwanted ions like hydrogen, most ion implanters employ mass analysis apparatus, which is usually done with an aide of magnetic field created by electromagnet. Examples of other typical dopant elements of which the source gas is comprised include phosphorous (P), arsenic (As), or Boron (B).

The dosage and energy of the implanted ions are varied according to the implantation desired for a given application. Ion dosage controls the concentration of implanted ions for a given semiconductor material. Typically, high current implanters are used for high dose implants, while medium current implanters are used for lower dosage applications. Ion energy is used to control junction depth in semiconductor devices, where the energy levels of the ions in the beam determine the degree of depth of the implanted ions. The continuing trend toward smaller and smaller semiconductor devices requires a beamline construction which serves to deliver high beam currents at low energies. The high beam current provides the necessary dosage levels, while the low energy permits shallow depth ion implants. In addition, the continuing trend toward higher device complexity requires careful control over the uniformity of implantation beams being scanned across the workpiece.

In many ion implantation systems, a cylindrical ion beam is imparted onto a wafer target through mechanical and/or magnetic scanning, in order to provide the desired implantation thereof. Batch implanters provide for simultaneous implantation of several wafers, which are rotated through an implantation path in a controlled fashion. The ion beam is shaped according to the ion source extraction opening and subsequent shaping apparatus, such as the mass analyzer apparatus, resolving apertures, quadrupole magnets, and ion accelerators, by which a small cross-section ion beam (relative to the size of the implanted workpiece) is provided to the target wafer or wafers. The beam and/or the target are translated with respect to one another to effect a scanning of the workpiece. However, in order to reduce the complexity of such implantation systems, it is desirable to reduce the scanning mechanisms, and to provide for elongated ribbon-shaped ion beams. For a ribbon beam of sufficient longitudinal length, a single mechanical scan may be employed to implant an entire wafer, without requiring additional mechanical or magnetic raster-type scanning devices, for example.

FIG. 1 (See U.S. Pat. No. 5,350,926) illustrates a typical prior art broad ribbon beam ion implanter 100 for the implanting of silicon wafers which employs two separate magnets to produce a ribbon-shaped ion beam. Mass analysis of the ion beam, carried out with the first magnet and the second magnet, is utilized to distribute the ions in a more parallel pattern. The two magnetic system can create a uniform ion beam with adequate implantation purity and is a popular system within the ribbon-beam ion implantation industry. The prior art ribbon beam implantation system 100, however, suffers several difficulties when attempting to attain the ribbon beam current densities, energy and uniformity, for example. Typically, this system 100 necessitates a wide spatial footprint because of the two separate magnet assemblies, the optical cross over of the beam, the system is complex and the various components used to resolve the ion beam make the system expensive. Additionally, in this architecture, there is a sacrifice of beam transmission at low energy "drift" mode, since the beam line is much longer.

Another prior art broad ribbon beam system is illustrated in FIG. 2, (See U.S. Pat. No. 5,834,786) where the system 200 employs an optics architecture that utilizes a single magnet to form a parallel beam out of a small diverging ion source and also achieves mass analysis. This type of implantation apparatus and system has been typically used in implanting flat panel displays with uniform ribbon beams. Use of the ribbon-beam ion implanter 200; however has challenges with respect to inadequate mass resolving power.

Another conventional prior art broad ribbon beam technique is employed in an ion implantation system 300, wherein the ion source is as wide as the final width of the beam, and a single magnet assembly 302 is designed not to disturb the starting beam 304 parallelism out of the extraction system. The magnet assembly is designed so that each coil 306 and 308 is wrapped around a yoke 310 to create a uniform magnetic field across the wide direction of the gap, and the ion beam 304 is bent up or down according to the mass of the ions and by utilizing a horizontal aperture so that the mass analysis is accomplished. The magnet assembly 302 is designed solely for mass analysis alone and does not have any focusing effect in the direction perpendicular to the bending direction (side-side direction in FIG. 3). To obtain a parallel broad beam on the exit side of the magnet assembly, the beam 304 has to enter the magnet assembly 302 in a parallel fashion. Otherwise, it requires another focusing element after the magnet 302 to convert the non-parallel beam into a parallel beam. The above solution, however, requires that the beam enter the magnet as a wide parallel beam and that can restrict the kinds of ion sources used.

The magnet assembly used in FIG. 3 could be replaced with other types of magnet assemblies, providing the magnet has sufficient gap width to allow the entire beam to pass through it and the field is uniform across the gap. For example, a conventional dipole magnet 400, shown in FIG. 4a may be employed if the gap is expanded, however, a wide gap dipole magnet assembly tends to make the field unacceptably non-uniform, as shown. The magnet assembly shown in FIG. 3, is shown in cross-section in FIG. 4b, at 420. Two coils 422 and 424 wrap around two return yokes and the field within the gap is now very uniform. However, a serious drawback of this magnetic configuration is that it creates an enormous leakage field outside of the magnet assembly. The power necessary in this configuration has to support the unused magnetic leakage in addition to the useful magnetic field in the gap and therefore the efficiency is poor. Another type of magnet, typically referred to as a window frame magnet can provide a uniform magnetic field across a wide gap without creating unacceptable leakage field outside of the magnet assembly. A prior art window frame magnet assembly 400, is illustrated with reference to both FIG. 4 and FIG. 5. This basic window frame magnet could be configured with a wide gap as illustrated in FIG. 4c and be employed in a ribbon-beam ion implantation system as shown in FIG. 5. Referring to FIGS. 4 and 5, the window frame magnet assembly, 400 and 500 is constructed in which traditional pole pieces are missing and two coils, 402 and 404, occupy the area on either side of the active area 406, enclosed by a iron yoke 412. A positive current, current as seen into the paper in FIG. 4, is running through the coil 402, whereas a negative current, current as seen as out of the paper in FIG. 4, is driven through coil 404. For clarity purposes, no current return paths are shown in FIG. 4.

One draw back to the magnet assembly 500 is the window frame magnet assembly 500 bends the ion beam in only one direction and similarly to the case in FIG. 3, the starting beam that enters the magnet assembly 412 has to be parallel and wide to obtain a parallel wide beam on the exit side.

Accordingly, it is desirable to provide a single magnet assembly for creating a broad ribbon-shaped ion beam with improved mass resolution profile properties for use in such broad beam ion implantation systems.

SUMMARY OF THE INVENTION

The present invention is directed to a single window frame magnet assembly for ion implantation systems, by which a broad ribbon-shaped ion beam of uniform density with resolved mass properties may be provided for implanting a workpiece, such as a semiconductor wafer, flat-panel display, and the like. The invention provides an ion beam with a uniform density and resolved mass, properties, which may then be used for implantation of semiconductor wafers in a single electromechanical scan, thereby simplifying the implantation system. In one implementation, the invention can be employed to provide ribbon beams up to 400 mm in length, so as to facilitate single scan implantation of 300 mm semiconductor wafer workpieces, for example.

The present invention is directed to an ion implantation system operable with a single magnet assembly to generate a broad or ribbon shaped ion beam and direct such a beam toward a workpiece. The implantation system comprises a single special cross field magnet assembly operable to receive a diffused ion beam and deflect such beam through the assembly active magnetic area thereof. The special magnet assembly acts as both a parallel focusing device and a mass analyzer of the ion beam and the present invention is configured to employ a single magnet in a smaller spatial area than conventional systems.

In accordance with one aspect of the present invention, a ribbon beam ion implantation system is disclosed having an ion beam source, a magnet assembly, a mass resolving aperture, and an end station. The magnet assembly has an entrance end and an exit end, and is operable to deflect selected ions having a desired momentum within the ribbon beam along a predetermined curvilinear path from the entrance end to the exit end thereof. The special cross field magnet assembly further comprises two pairs of magnet coils, a first pair of magnetic coils located along top and bottom of the assembly and a second pair of magnetic coils located on both sides of the assembly, orthogonal to the first pair. The ion beam source is located proximate the assembly entrance end, and the resolving aperture is located proximate to the exit end of the magnet assembly. The first pair of coils creates a (horizontal) magnetic field whose function is to deflect the ion beam up or down depending its ion mass properties, thereby providing a means to select only one ion mass, and the second pair of coils creates a (vertical) magnetic field to converts the original beam into a parallel beam in the other orthogonal direction.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 5 is an isometric view illustrating a prior art broad beam mass analysis system using a window frame magnet shown in FIG. 4c;

FIG. 10a is a simplified isometric view schematically illustrating the cross field window frame magnet assembly shown in cross section in FIG. 9, according to yet another aspect of the invention;

DETAILED DESCRIPTION OF THE INVENTION

Figure 1:
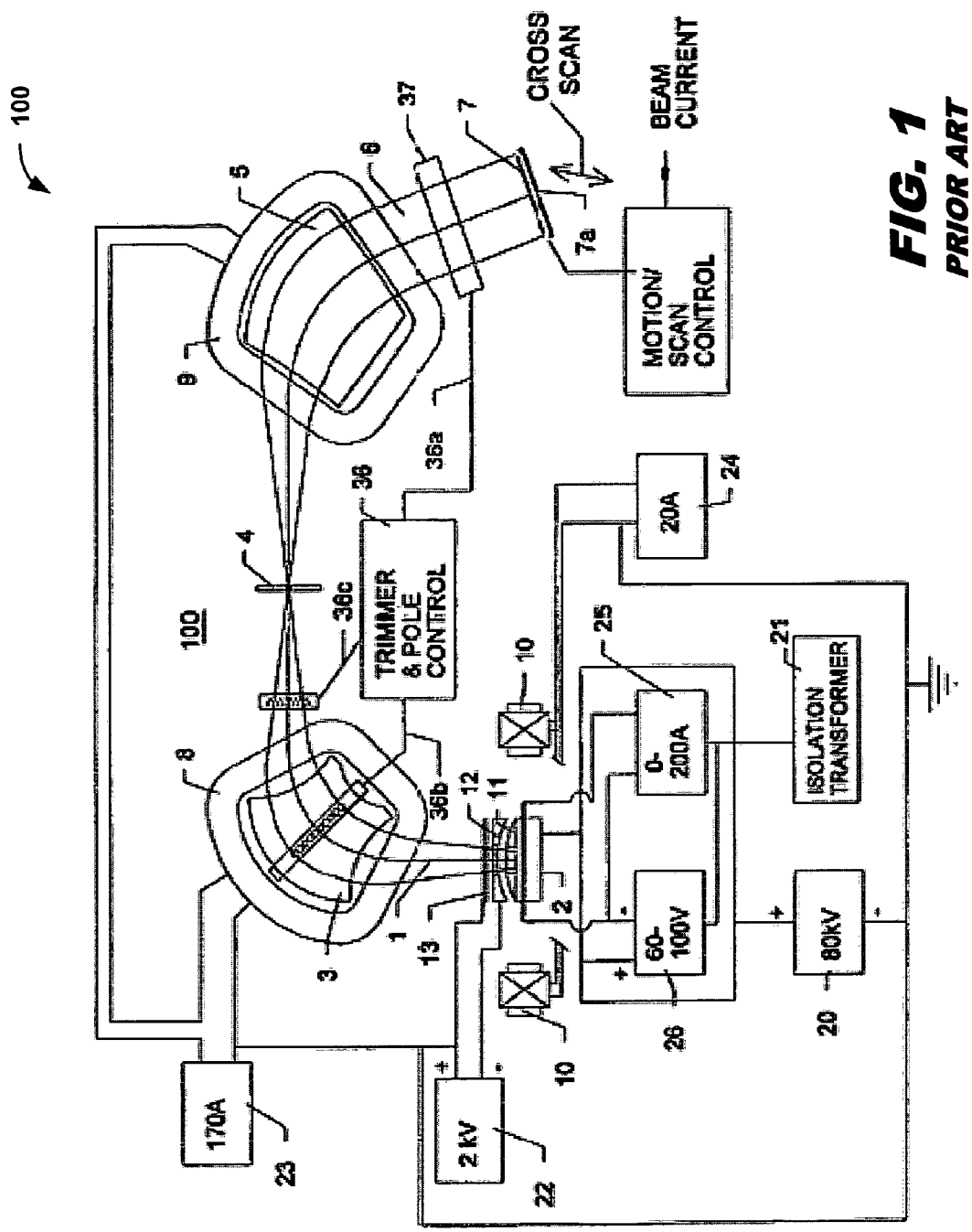
FIG. 1 is a schematic view illustrating a prior art broad ribbon beam ion implantation system that employs two magnets.

The present invention will now be described with reference to the drawings wherein like reference numerals are used to refer to like elements throughout. The invention provides an ion source apparatus for creating elongated ion beams in an ion implantation system having a controllable density profile and other novel features for enhancing uniformity of ionized plasma within the source. One implementation of the various aspects of the invention is hereinafter illustrated and described. However, it will be appreciated that the illustrations and descriptions thereof are exemplary in nature, and that one or more aspects or novel features of the present invention may be carried out in other systems apart from those illustrated and described herein.

Figure 6:
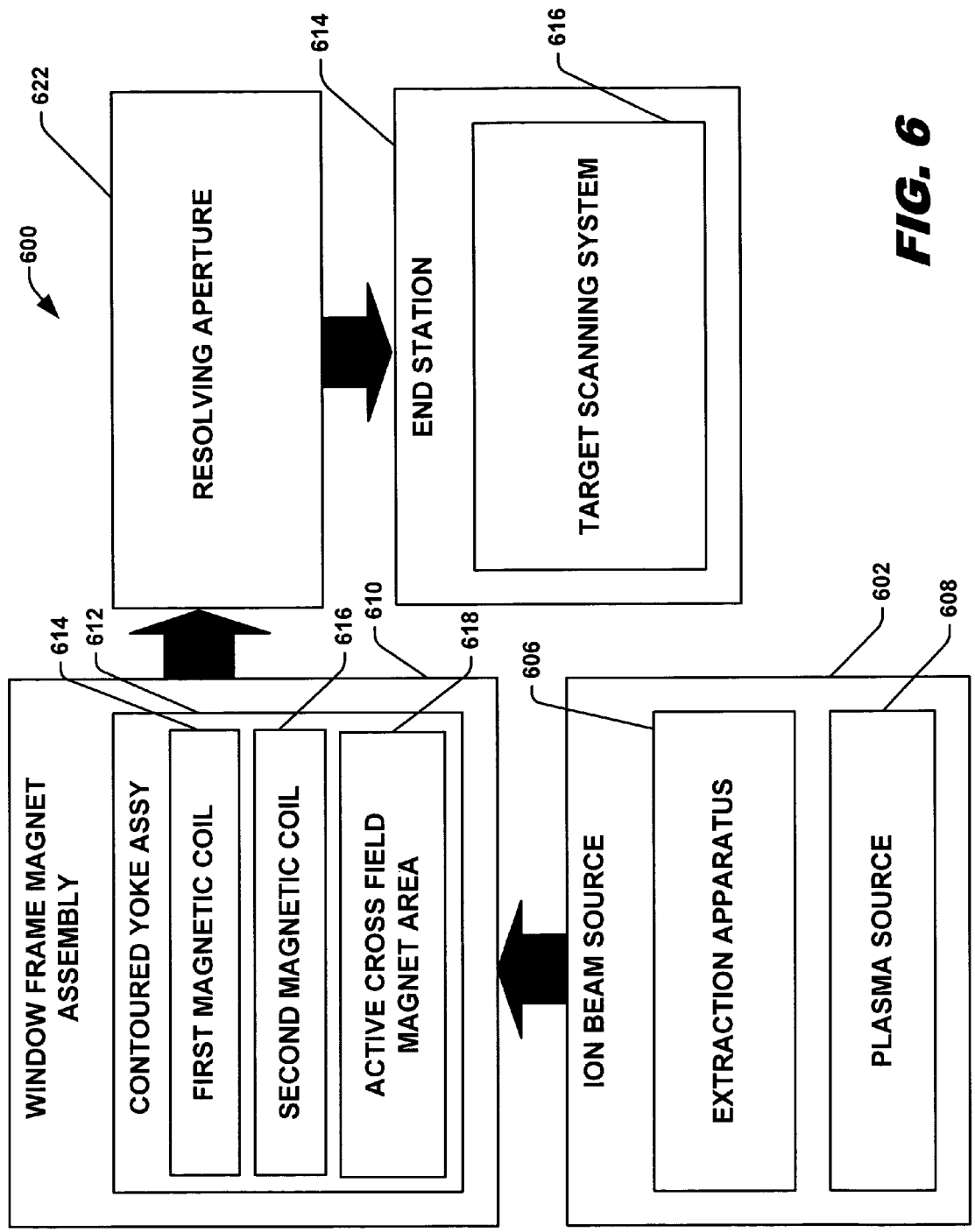
FIG. 6 is a block diagram illustrating one implementation of an ion ribbon beam assembly system, according to one aspect of the invention.
Figure 7:
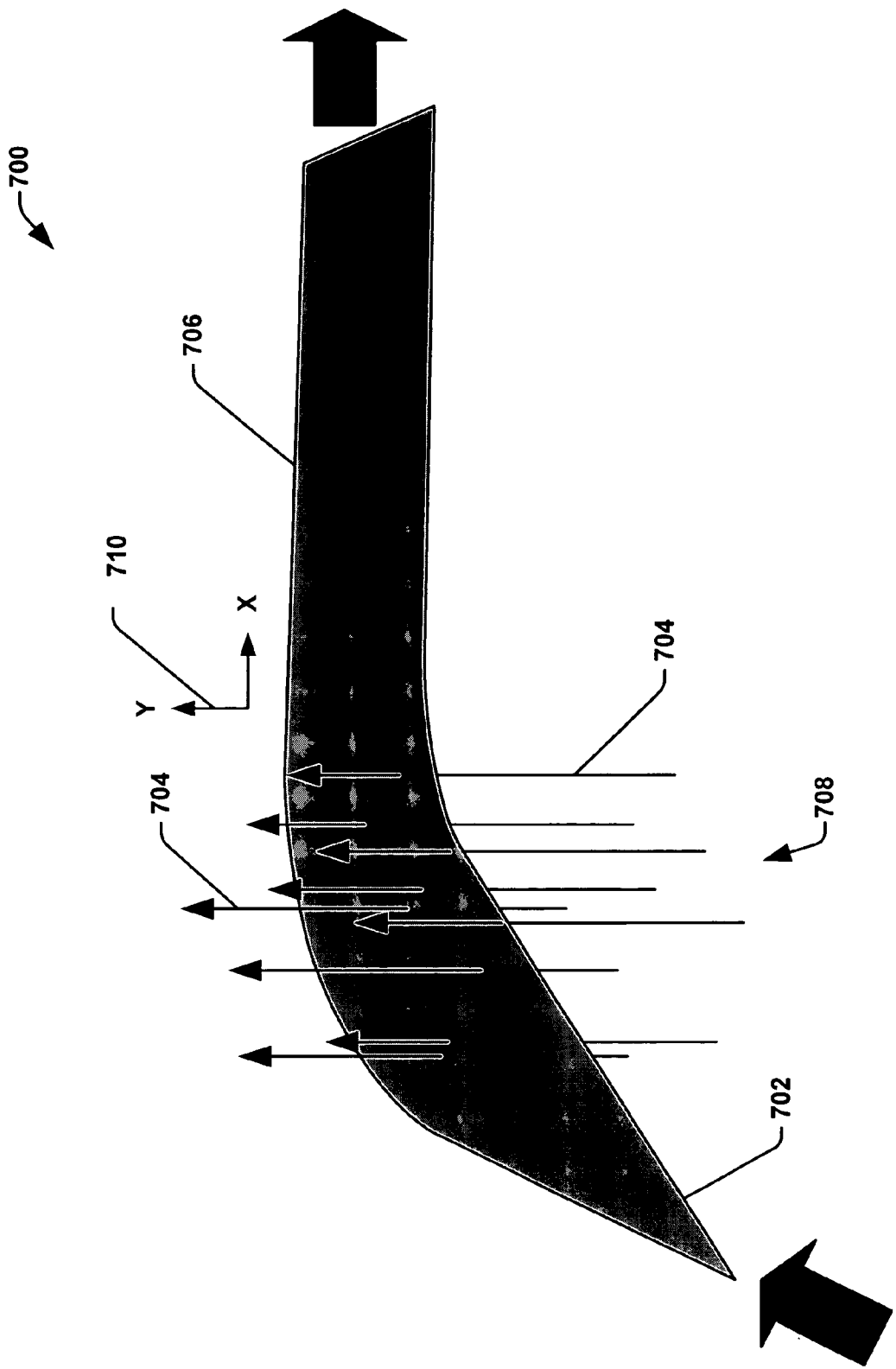
FIG. 7 is a simplified isometric view of a deflected broad ribbon beam resulting from employing the prior art assembly depicted in FIG. 2.
Figure 8:
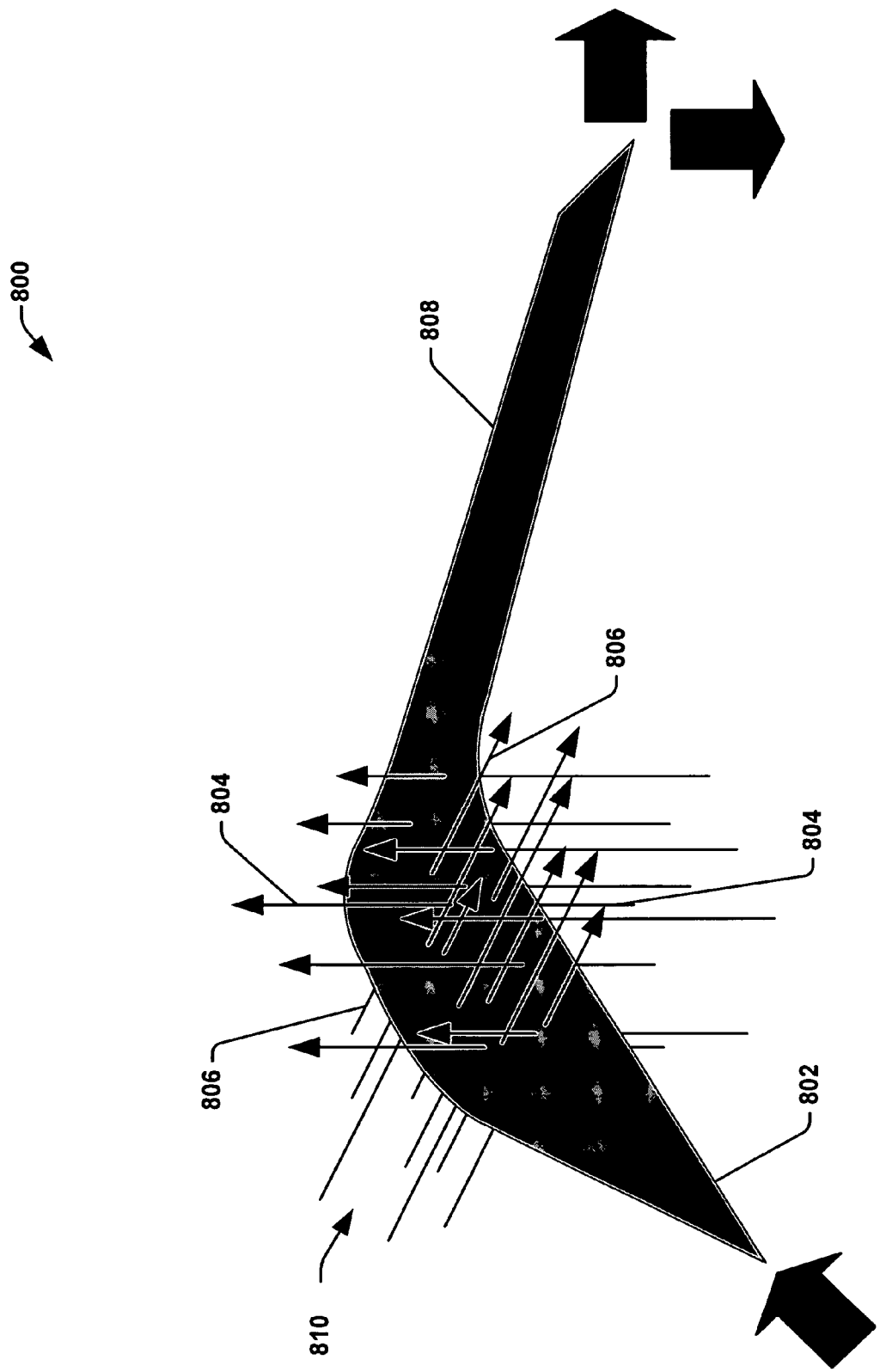
FIG. 8 is an isometric view illustrating a deflected and mass analyzed ribbon beam according to yet another aspect of the invention.

Referring initially to FIGS. 6, 7, 8 and 9a, an ion broad beam implantation system 600 is generally illustrated in accordance with the present invention, which may be used to create a wide ribbon and/or broad ion beam. The ion beam source 602 comprises a plasma source 604 and an extraction component 606, wherein plasma can be generated by ionizing a source material, for example, phosphine ($PH_3$), phosphorous (P), arsenic (As), Boron (B), and the like. The ion beam source 602 comprises an extraction slit through which an ion beam may be extracted utilizing the extraction apparatus 606, wherein the ion beam is extracted as a uniform diverging beam. The ion beam then enters the window frame magnet assembly 610, which comprises a first pair of coils 902, coil 904 and 906 in FIG. 9a, to produce uniform vertical field over a wide area, a second pair of coils 908, coil 910 and 912 in FIG. 9, to produce an uniform horizontal field across the entire width of the broad beam, a yoke assembly 612 to act as return path for both pairs of coils, 902 and 908. The first magnetic coil 614 is configured so that the magnetic field flux 704, shown in FIG. 7, or 804 in FIG. 8, is orthogonal to the plane of the divergent beam and the resultant ribbon beam 702 is deflected in a vertical Y direction 710. The entire field in FIG. 7 is referred to as a vertical B field 708 and the exiting beam 706 is deflected as shown.

The second magnetic coil 616 depicted in FIG. 6 creates a second magnetic flux 806, as shown in FIG. 8, that is orthogonal to the magnetic field flux 704 generated by the first magnetic coil 614 and the entire field is referred to as a horizontal B field 810. One aspect of the invention provides that by the addition of the uniform horizontal B field 810 across the plane of the ion ribbon beam can create an improved mass dispersion, since the beam size in vertical dimension is thin (e.g., much thinner than its width). Therefore, the mass resolving power of the magnet assembly 610 and the ion implantation system 600 can be greatly enhanced, as well. The magnetic fields 810 and 812 induce orthogonal Lorentz forces to the in coming ion beam to deflect the beam in two directions, horizontally and vertically to form a ribbon beam 808, as a result. In other words, the vertical magnetic field, 804, is used to convert the diverging beam out of ion source into a parallel beam, and the horizontal magnetic field, 810, is used to deflect the sheet of broad beam vertically to provide vertical position dispersion according to ion mass properties of the incoming ion beam.

Figure 9A:
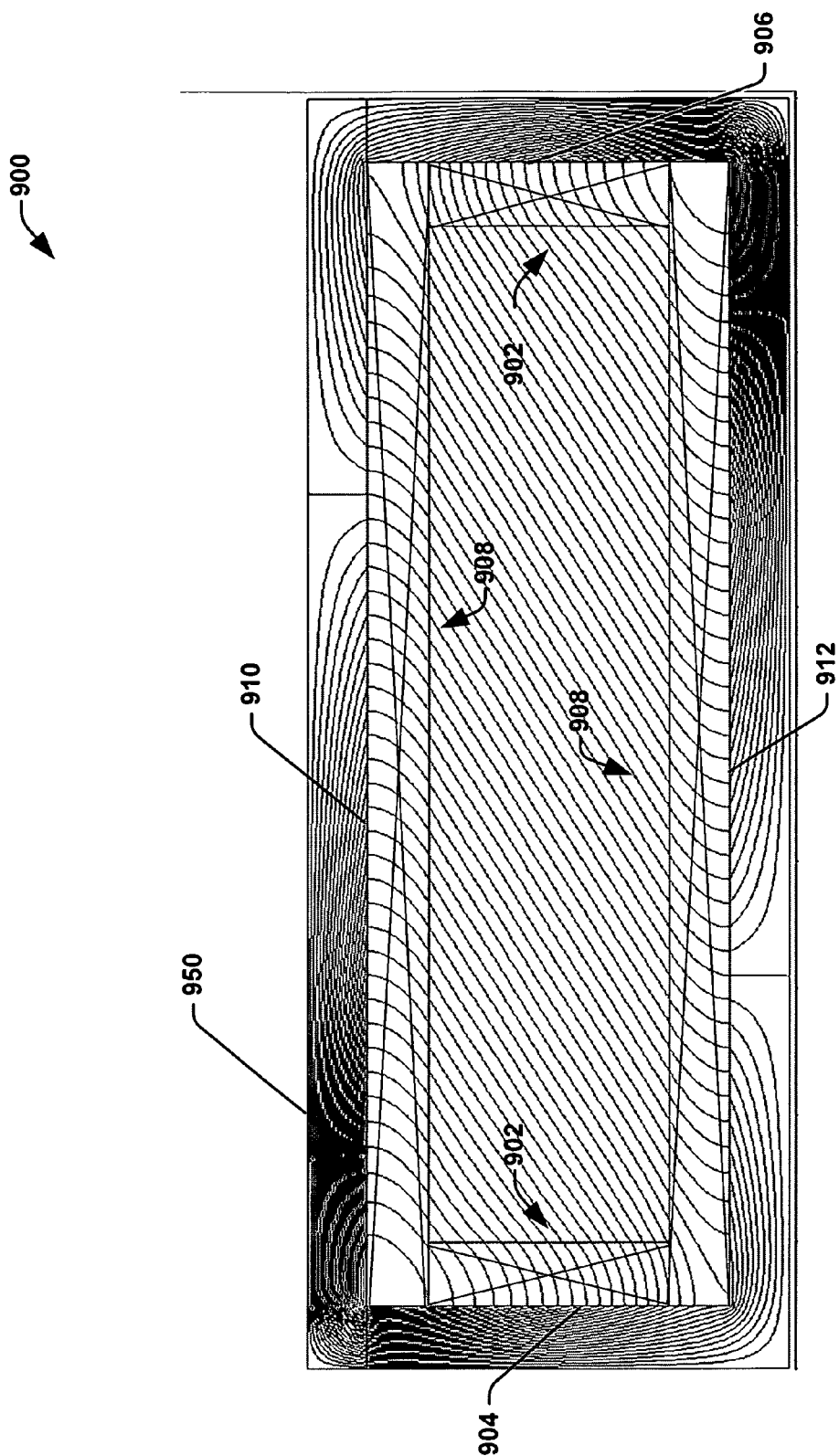
FIG. 9a is a simplified cross sectional view of a cross field magnet, according to yet another aspect of the invention.

FIG. 9a illustrates a cross section of a cross field window frame magnet assembly 900 employed to create the required uniform cross magnetic field utilizing a single magnet. Another aspect of the present invention is illustrated in FIG. 9a, wherein the window frame magnet assembly 900, shown in cross section, can be constructed in order to create a magnetic cross field. In order to achieve the cross-field X-Y, illustrated in FIG. 8, an orthogonal vertical B field can be added by utilizing a second pair of coils 908, coil 910 and coil 912, in addition to the first pair of coils 902, coil 904 and coil 906. The coils can be contained within a rectangular cross sectional housing 950, for example. Those of ordinary skill in the art will recognize many modifications that may be made to housing shape and design configuration without departing from the scope or spirit of what is described herein in this invention.

Figure 9B:
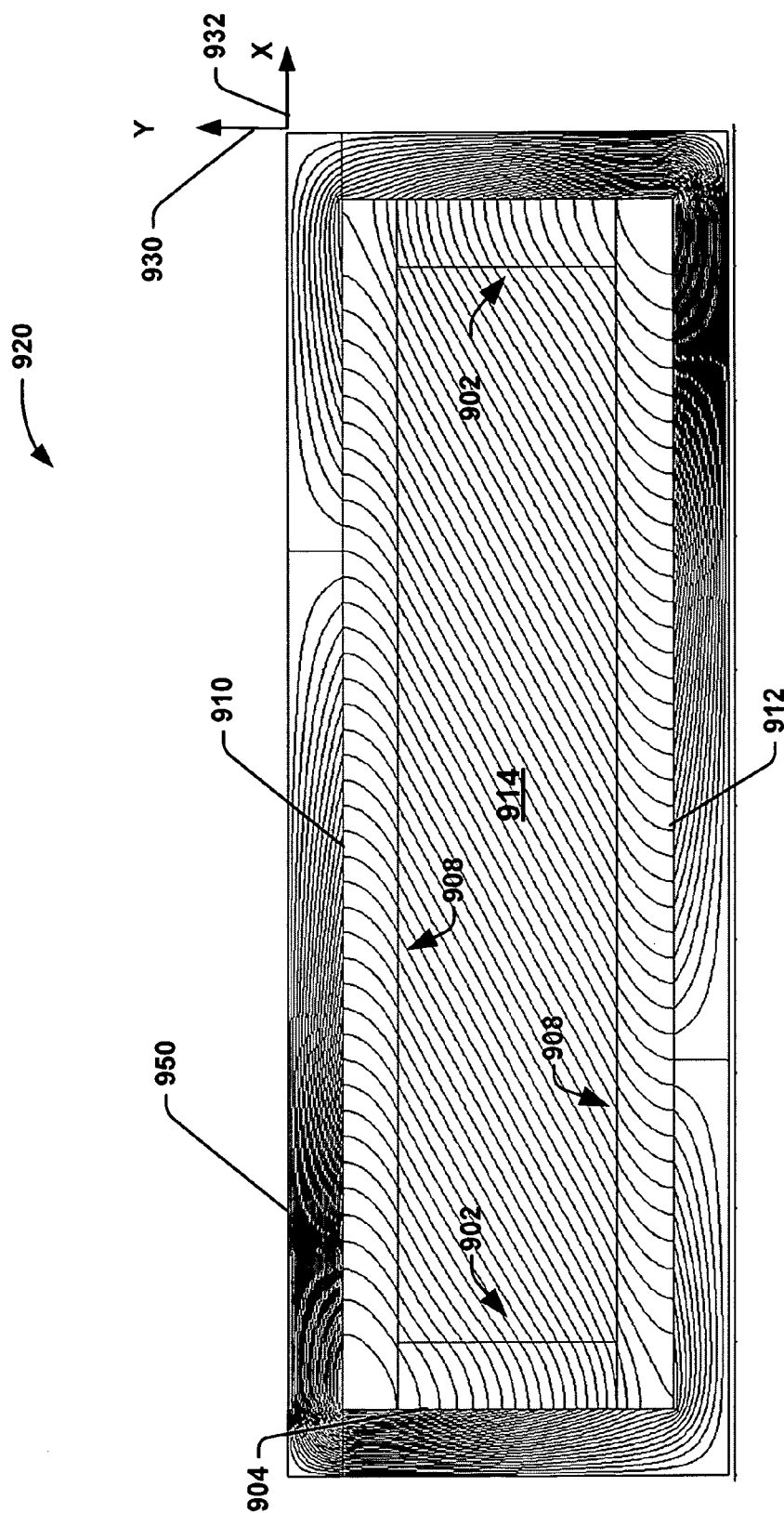
FIG. 9b is a cross sectional view of a cross field magnetic field employing two pairs of coils have a same current density, according to an aspect of the current invention.

FIGS. 9a and 9b 2D simulation results 900 and 920 with "POISSON" software to show the resulting cross field within the gap 914. Coils 910 and 912 are a pair and their current densities are equal, but the direction of their currents are directly opposite each other, for example, the current for coil 910 is into the paper in FIG. 9b, whereas for coil 912 the current direction is out of paper. The same configuration can be utilized for the other coils 904 and 906, for example. As shown in the simulation, the magnetic field within each coil pairs 902 and 908 is approximately uniform in both the vertical Y direction 930 and the horizontal X direction 932. In this simulation, the current density on all four coils was selected to be the same and the result is an identical field strength in horizontal 932 and vertical direction 930, for example. Of course, different current densities can be employed between coil pair 902 and coil pair 908 to allow two independent controls over bending the ion beam in both directions, as illustrated in FIG. 9b shows an exemplary illustration, in which the current density of the coil pair 902 is reduced to 50% of the current density for the other coil pair 908. As shown in the simulation, the field in the gap 914 has a larger horizontal 932 magnetic component than a vertical 930 magnetic component. Of course, those of ordinary skill in the art will recognize many modifications that may be made to this magnetic coil design configuration, without departing from the scope or spirit of the invention described herein.

FIG. 10a is an isometric view of yet another aspect of the present invention, illustrating a cross field window frame magnet assembly system 1000. A divergent ion beam 1002 can be directed into the magnet assembly 1004, for example. The single window frame cross field magnet assembly 1004 can bend the ion beam 1002 in two directions, horizontally and also vertically, as it traverses the inside of the magnet assembly 1004. Bending the beam in the horizontal plane can result in parallelizing the divergent ion beam 1002 out of the assembly 1004. The vertical plane magnetic field can be employed to obtain mass dispersion in the vertical direction, depending upon the mass of ions within the ion beam 1002, in order to obtain better mass analysis than that currently available in ion implantation systems.

Figure 2:
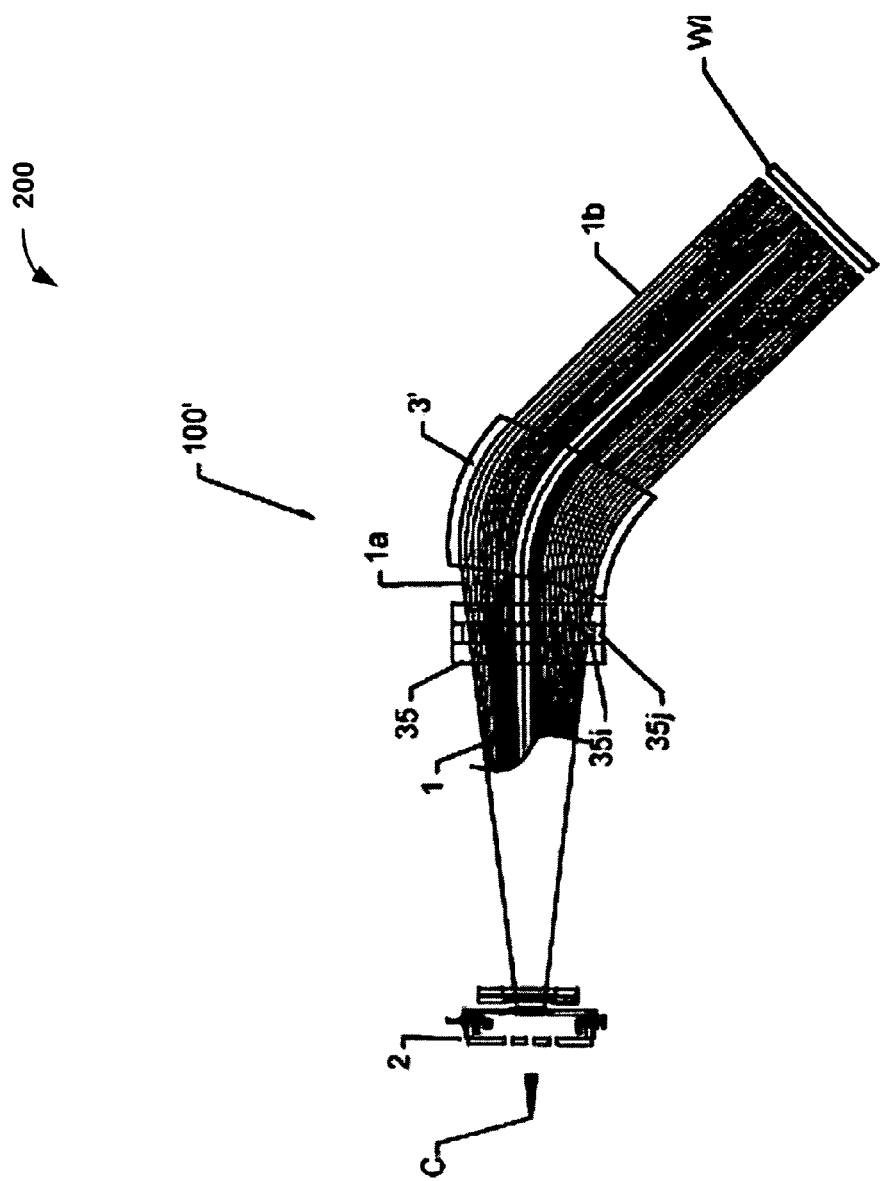
FIG. 2 is a schematic view illustrating another prior art ribbon beam ion implantation system that employs a single magnet.
Figure 3:
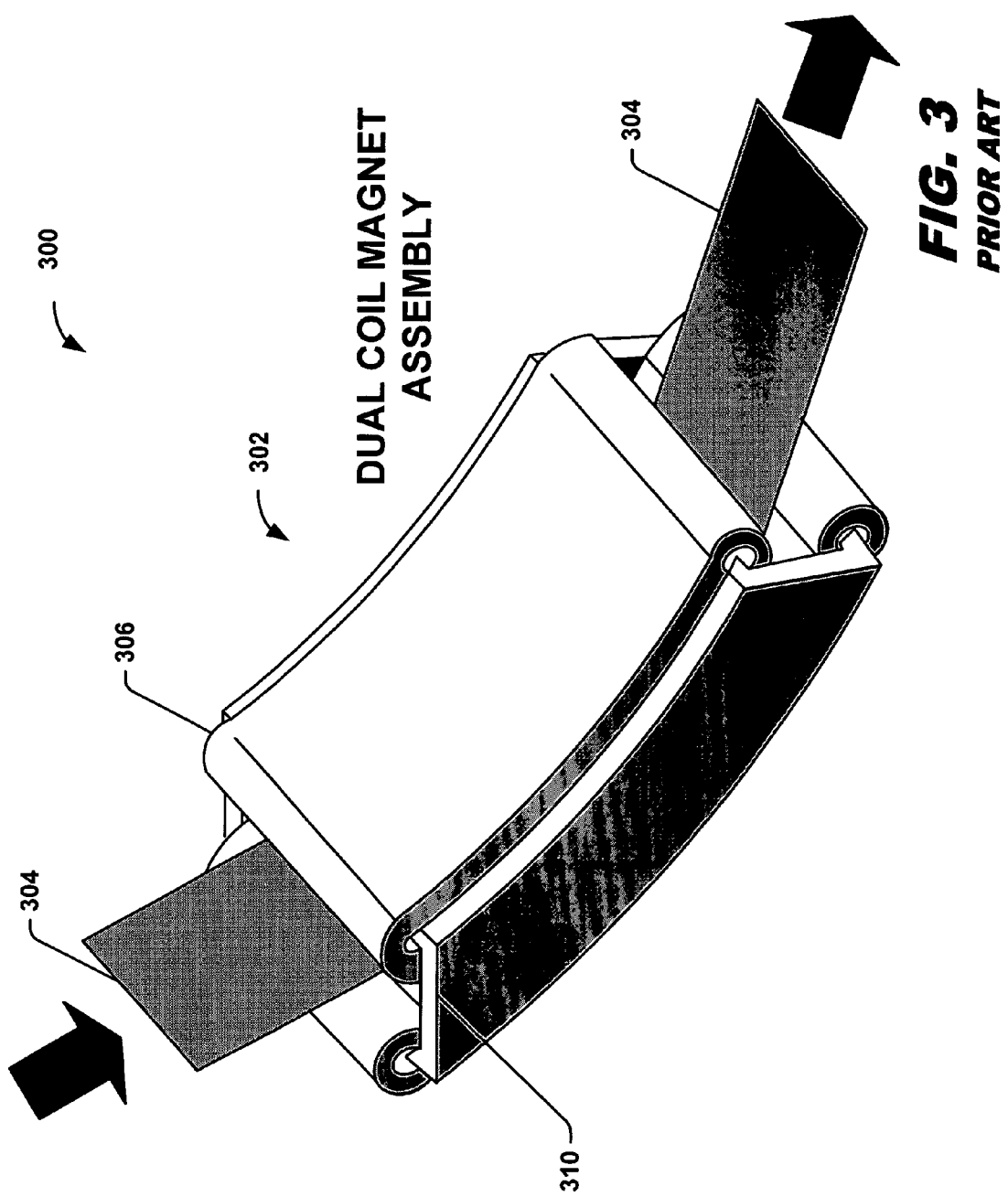
FIG. 3 is a isometric view illustrating another exemplary prior art broad ribbon beam system that employs a single magnet with two magnet coils wrapping around two return yokes.
Figure 4:
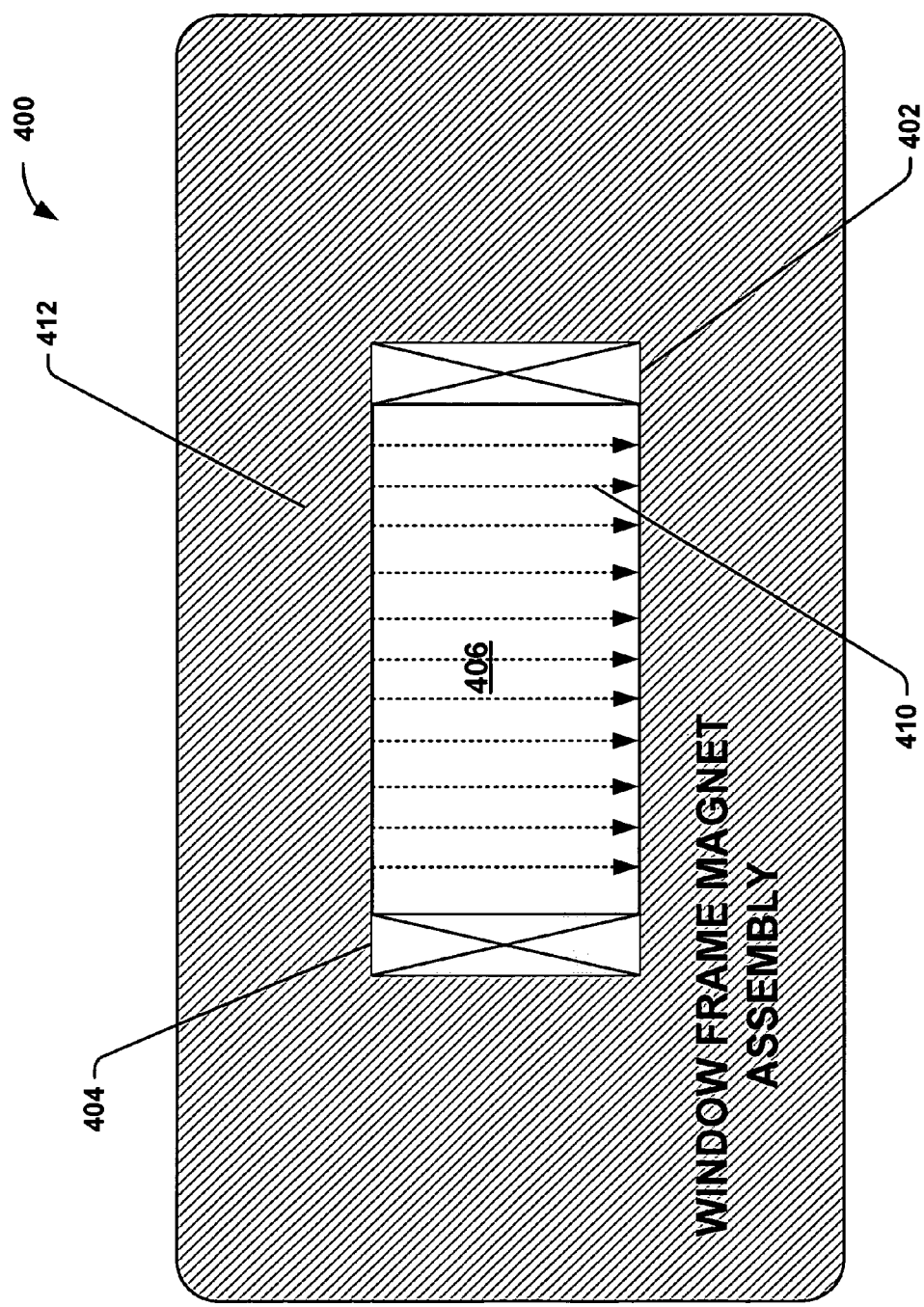
FIG. 4 is a cross sectional view, illustrating a prior art window frame magnet assembly.
Figure 4A:
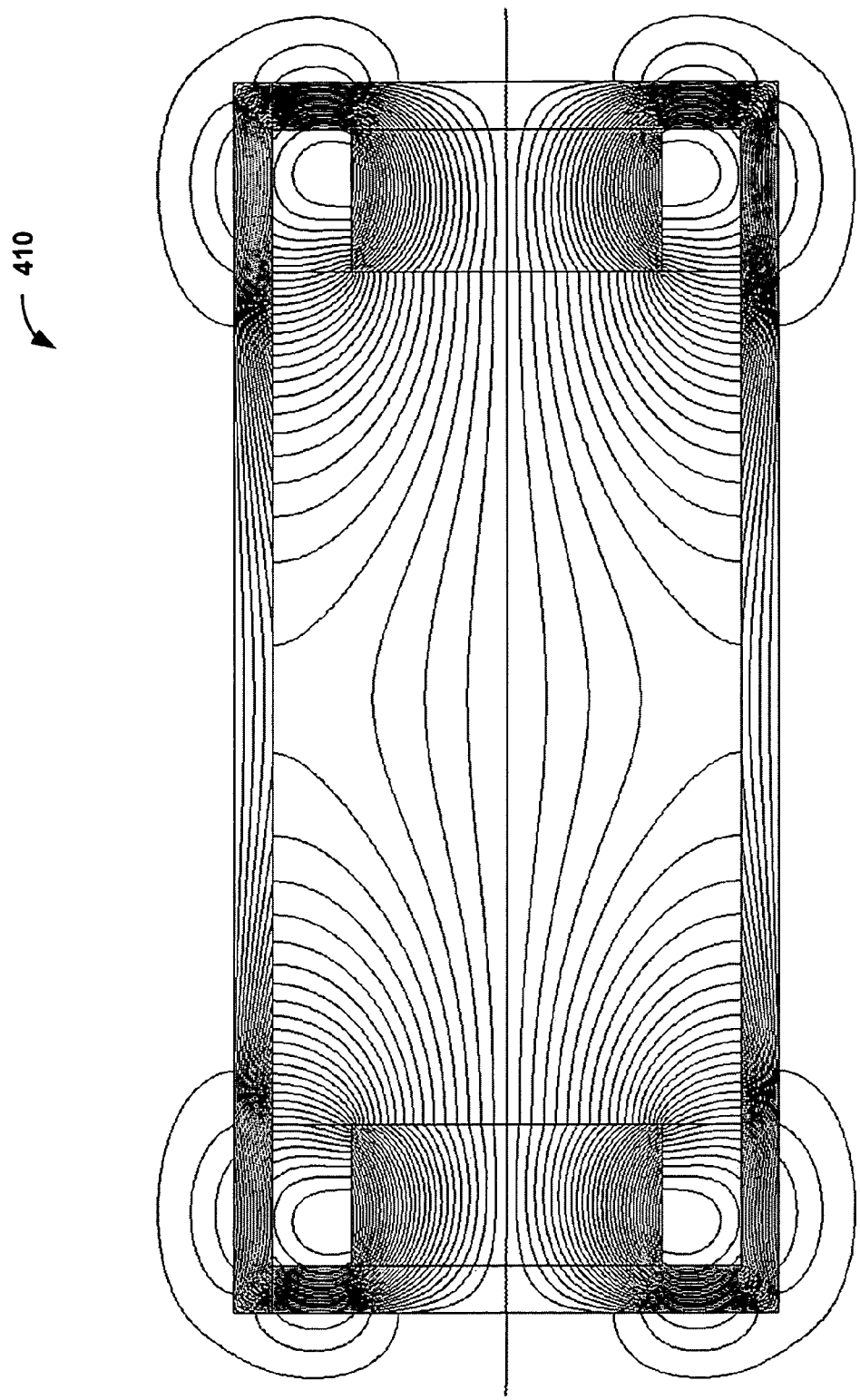
FIG. 4a is a prior art conventional dipole magnet stretched for broad beam.
Figure 4B:
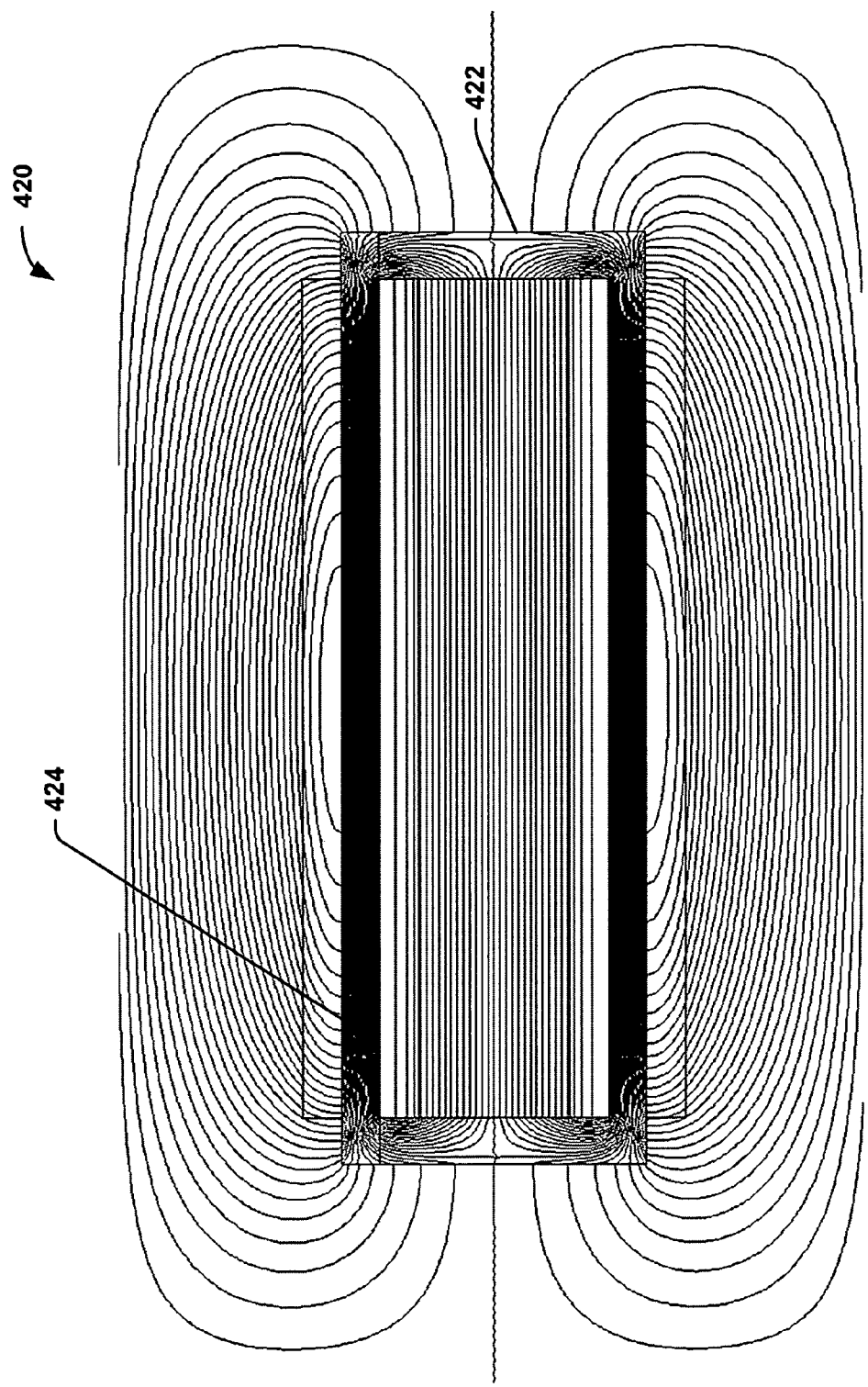
FIG. 4b is another type of prior art window frame magnet used in FIG. 3 with wrap-around coils for broad beam.
Figure 4C:
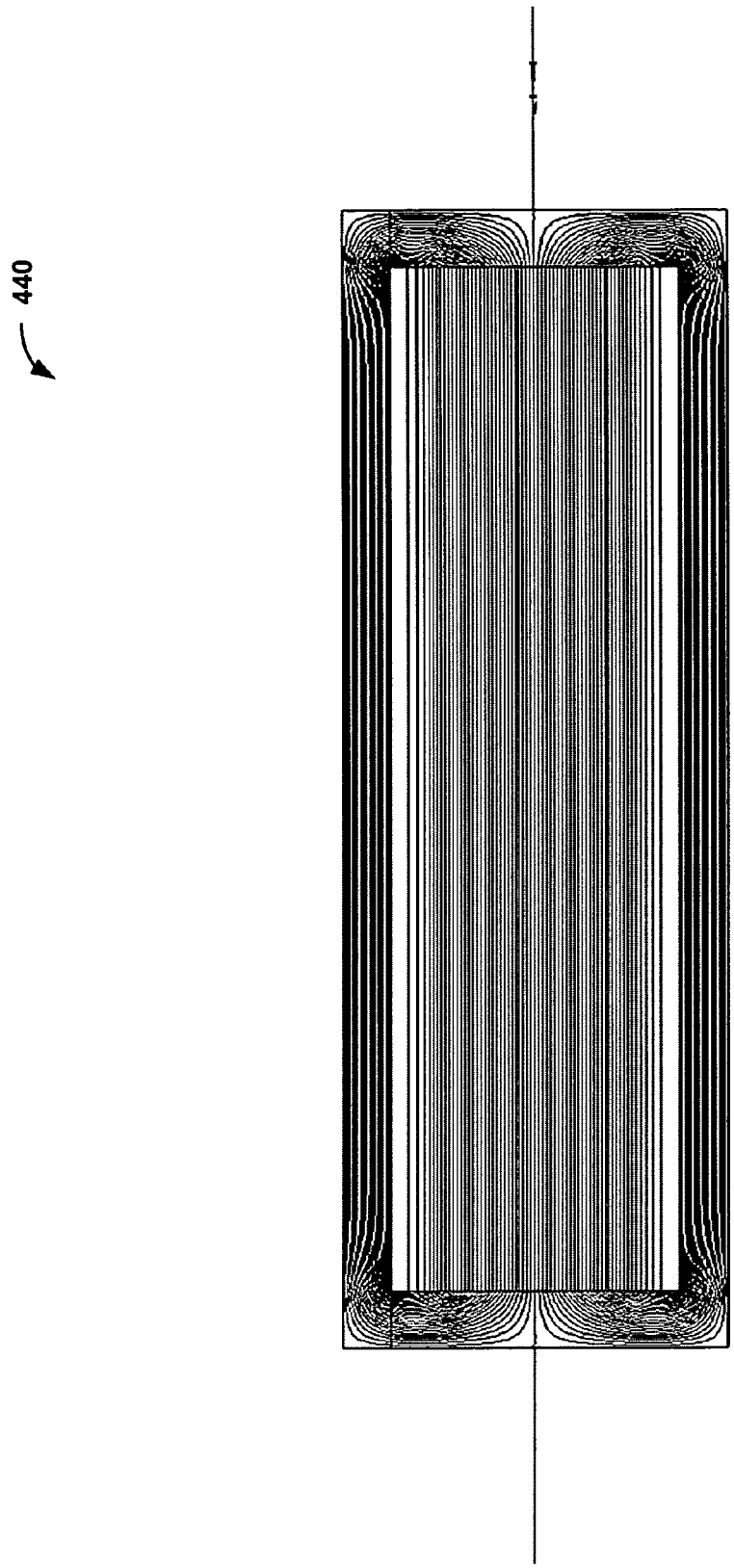
FIG. 4c is a prior art window frame magnet configured to have wide uniform field for broad beam.
Figure 10B:
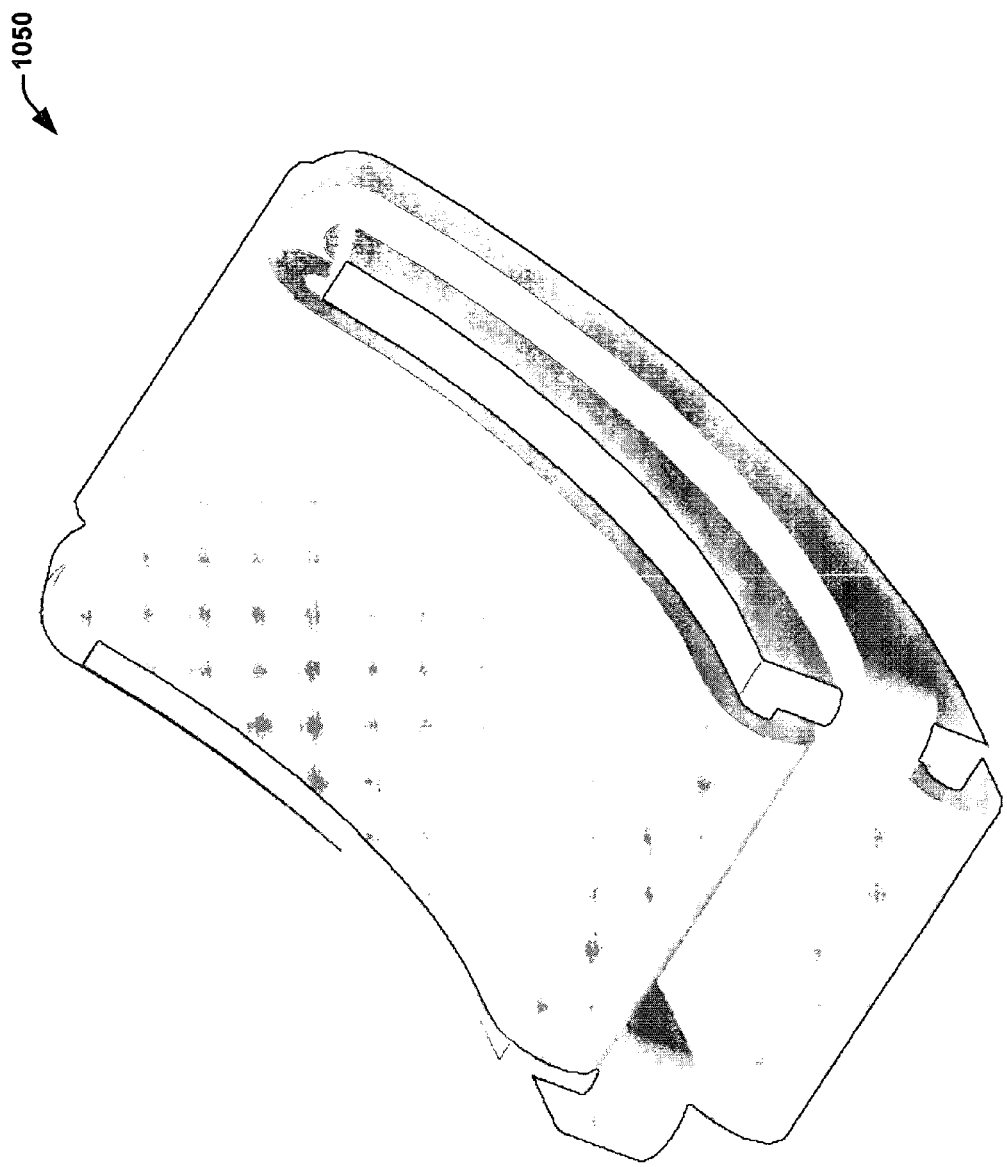
FIG. 10b is an alternative way to make cross field within a single magnet, using two pairs of coils wrapping around 4 legs of return yokes.

A broad ribbon beam ion implantation system with this magnetic architecture can be both shorter than conventional systems like the one shown in FIG. 1 and provides more mass resolving power than the architecture shown in FIG. 2 because the final beam 1006 has been magnetically resolved in two directions and unlike the architecture shown in FIG. 3 which requires a wide parallel-beam producing ion source, t this architecture allows to use much smaller size ions source producing a diverging beam. An alternative magnet assembly to produce the required uniform cross field is shown in FIG. 10b. The coils in FIG. 10b wrap around 4 legs of return yokes instead of being contained in the rectangular return yoke in FIGS. 9a and 10. This magnet system, like a magnet shown in FIG. 3, produces large leakage field outside of the system and suffers poor efficiency. However, it will produce the required uniform cross field within the gap. Although the exemplary magnetic assembly 1004 comprises a rectangular window frame magnet structure, other elongated general shapes are possible within the scope of the present invention, for example, ovals, cylinders, and the like. As used herein, the term general shapes include such other shapes distributed along a curvilinear path configured to provide an elongated ribbon-shaped ion beam with adequate mass resolution. It will be appreciated that magnetic coils within the scope of the present invention can include any combination of magnetic coils greater than one, configured in a single magnet assembly 1004.

Figure 11:
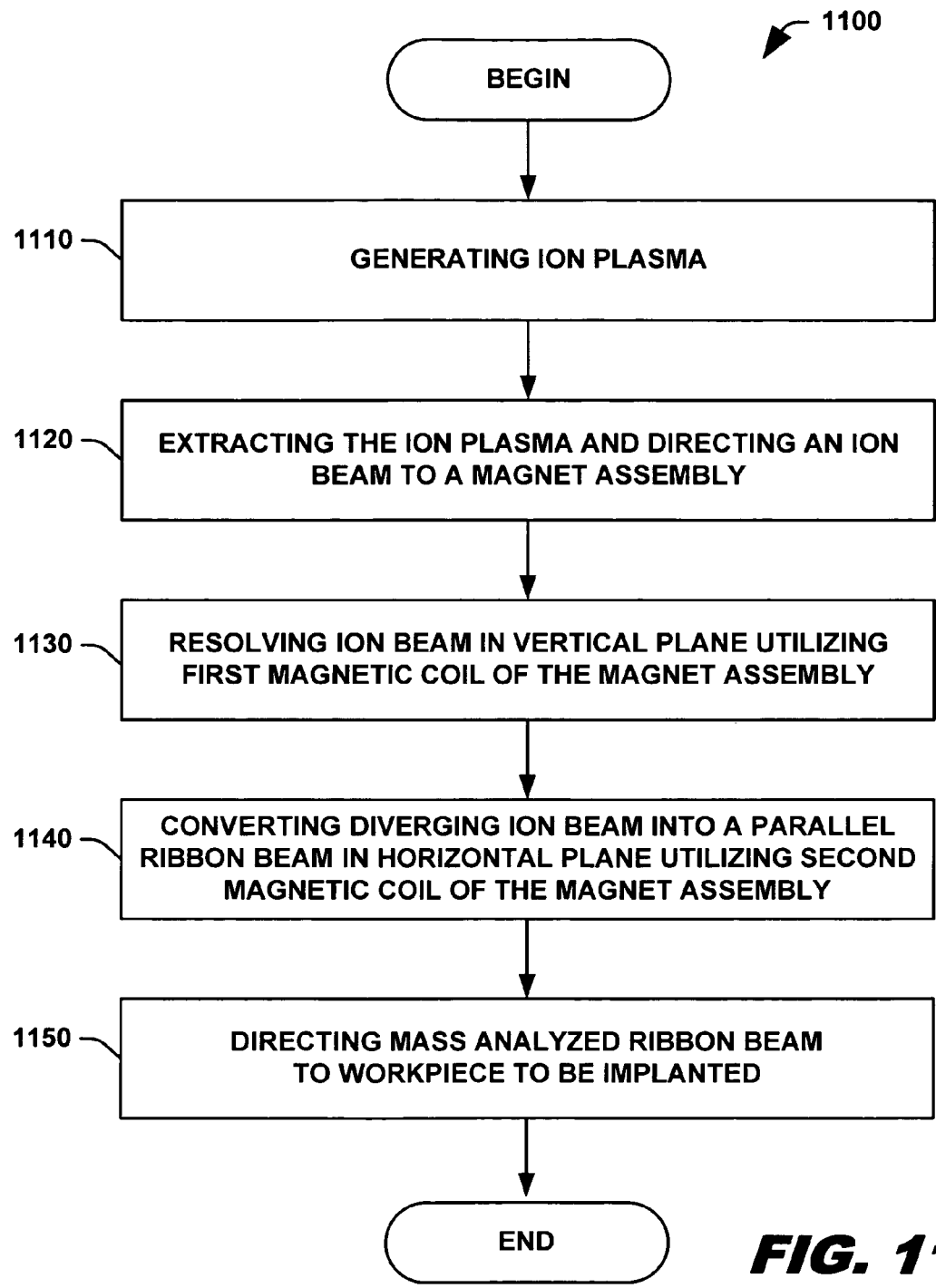
FIG. 11 is a block diagram of an exemplary method for improving an ion ribbon beam of an ion implantation system according to another exemplary aspect of the invention.

In accordance with yet another aspect of the present invention, a method of mass analyzing a ribbon beam is provided, as illustrated in FIG. 11 and designated at reference numeral 1100. Although the methodology 1100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated.

The method 1100 begins at 1110 with the generation of ion plasma utilizing the plasma source within the ion beam source, for example. An ion beam is extracted at step 1120 and directed toward a window frame magnet assembly. The ion beam can be a divergent beam, a ribbon beam, and the like. At least two magnetic coils are located within the magnet assembly and they can create both a magnetic vertical and magnetic horizontal field. The at least two magnet coils can be enclosed within a housing. In one example, the ion beam is parallel resolved by a first magnetic coil within the magnetic assembly at 1130. In one example, the ion beam entering the magnet assembly can be a diverging beam, wherein the first magnetic coil bends the magnetic coil in a vertical direction.

At 1140 the ribbon beam can be mass analyzed employing a second magnetic coil within the window frame magnet assembly. The second magnetic coil can bend the ribbon beam in the horizontal plane, and thus further mass analyze the ribbon beam. The ribbon beam can then be directed to a workpiece at 1150. For example, one or more faraday cups or other type detection mechanism(s) may be employed to detect the ribbon beam across it width and thus ascertain uniformity associated therewith. The process ends at 1150.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention includes a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising".

What is claimed is:

1. An ion implantation system for providing a mass analyzed ribbon beam, comprising:
   an ion beam source;
   a plasma source and an extraction component, wherein the extraction component is configured to extract a divergent ion beam and direct the ion beam to a single cross field magnet assembly;
   wherein the single cross field magnet assembly converts the divergent ion beam is converted into a parallel ion ribbon beam in a first plane after being deflected in a first direction; and
   wherein the single cross field magnet assembly further deflects the parallel beam in two directions, the first direction and a second direction that is orthogonal to the first direction, and that provide momentum dispersion in a second plane to mass-analyze the parallel ion ribbon beam.

2. The ion implantation system of claim 1, wherein the single cross field magnet assembly is a window frame magnet assembly; wherein the window frame magnet assembly comprises;
   the window frame magnet assembly with an entrance located proximate to the ion beam source;
   a contoured yoke assembly is configured with;
      a first pair of magnetic coils;
      a second pair of magnetic coils, placed orthogonally to the first pair; and
      an end station configured proximate to the magnet assembly exit, with a target scanning system, wherein the target scanning system and attached workpiece are impacted by the mass analyzed ribbon beam.

3. The ion implantation system of claim 1, wherein the single cross field magnet assembly comprises;

a first pair of magnetic coils which wraps around top and bottom of a return yoke; and a second pair of magnetic coils, placed orthogonally to the first pair, wrapping around both sides of return yoke.

4. The ion implantation system of claim 1, wherein the window frame magnet assembly comprises a plurality of magnet coils.

5. A window frame magnet assembly for mass resolving a divergent ion ribbon beam, wherein the window frame magnet assembly comprises:

a single cross field magnet assembly;

a central curvilinear axis and an active magnet area for converting the divergent ion beam into a parallel ion ribbon beam, wherein the central curvilinear axis is configured to direct the ion ribbon beam in a predetermined curvilinear path;

a contoured yoke assembly is configured to enclose the central curvilinear axis and surround the active magnet area for the traveling ion ribbon beam;

the contoured yoke assembly comprises a first coil assembly and a second coil assembly, an inner wall structure, an outer wall structure and the active magnetic area, wherein active magnetic area, directionally influences the parallel ion ribbon beam; and the parallel ion ribbon beam is shaped into a mass analyzed parallel ribbon shaped ion beam by the first and second magnetic coil assemblies; and wherein the ribbon shaped ion beam in a first plane was deflected in a first direction utilizing the first magnetic coil assembly;

wherein the first plane ribbon shaped ion beam is further resolved in a second plane by being deflected in the first direction and by being deflected in a second direction that is orthogonal to the first direction utilizing the second magnetic coil assembly.

6. The window frame magnet assembly of claim 5, wherein the first magnetic coil assembly extends along the top and first side of the contoured yoke assembly interior surface between the entrance opening and exit opening.

7. The window frame magnet assembly of claim 5, wherein the second magnetic coil assembly extends along the bottom and second side of the contoured yoke assembly interior surface between the entrance opening and exit opening.

8. A window frame magnet assembly for converting a divergent ion beam into a mass analyzed parallel ribbon ion beam in an ion implantation system, comprising:

the window frame magnet assembly is configured as a single cross field magnet assembly;

a generally rectangular active ferromagnetic area, wherein the center of the active magnetic area is disposed along a first curvilinear axis;

a first magnetic pair of coils is configured to form a top surface and a bottom surface disposed along and at a distance from the curvilinear axis;

a second magnetic pair of coils is configured to form both side surfaces disposed along and at a distance from the curvilinear axis;

a yoke assembly for containing the first and the second magnetic pair of coils;

wherein the parallel ribbon shaped ion beam in a first plane was deflected in a first direction utilizing the first magnetic pair of coils;

wherein the parallel ribbon shaped ion beam is further deflected in two directions, the first direction and a second direction utilizing the second magnetic pair of coils; and a ferromagnetic return yoke housing configured for enclosing the first and the second pairs of magnetic coils thereby forming the active ferromagnetic area.

9. The window frame magnet assembly of claim 8, wherein the first and second pairs of coils are electrically driven.

10. The window frame magnet assembly of claim 8, wherein the first and second pairs of coils are replaced with permanent magnets.

11. The window frame magnet assembly of claim 8, wherein the first and second pairs of coils are configured to create a broad mass analyzed ion beam without the use of an optical beam cross over.

12. A method of mass analyzing a ribbon shaped ion beam, comprising:

generating an ion plasma;

extracting the ion plasma and directing a divergent ion beam to a single cross field magnet assembly;

resolving the divergent ion beam into a parallel ribbon shaped ion beam that was deflected in a first direction utilizing a first magnetic coil of the magnet assembly;

further resolving the parallel ribbon shaped ion beam in two directions the first direction and a second direction that is orthogonal to the first direction utilizing a second magnetic coil of the magnet assembly; and directing parallel mass analyzed ribbon shaped ion beam to a workpiece to be implanted.

13. The method of claim 12, wherein the ion beam comprises a divergent beam, a parallel beam, a pencil beam, a broad un-scanned beam, and a wide ribbon beam.

14. The method of claim 12, wherein the entrance and exit faces of the return yoke are shaped for proper focusing the mass properties of the exit beam.

* * * * *